(12) United States Patent
Hubner

(10) Patent No.: US 7,253,530 B2
(45) Date of Patent: Aug. 7, 2007

(54) METHOD FOR PRODUCING CHIP STACKS

(75) Inventor: Holger Hubner, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 11/236,311

(22) Filed: Sep. 26, 2005

(65) Prior Publication Data

US 2006/0055051 A1 Mar. 16, 2006

Related U.S. Application Data

(63) Continuation of application No. PCT/DE04/00544, filed on Mar. 17, 2004.

(30) Foreign Application Priority Data

Mar. 24, 2003 (DE) ................... 103 13 047

(51) Int. Cl.
*H01L 23/52* (2006.01)
*H01L 23/48* (2006.01)
*H01L 29/40* (2006.01)

(52) U.S. Cl. .............. 257/777; 257/686; 257/E25.006; 257/E25.013; 257/E25.021; 257/E25.027; 257/E23.085; 438/109; 438/110

(58) Field of Classification Search .................. None
See application file for complete search history.

(56) References Cited

U.S. PATENT DOCUMENTS

| 3,577,037 | A | * | 5/1971 | Di Pietro et al. | ........... 257/621 |
| 4,122,479 | A | * | 10/1978 | Sugawara et al. | ............ 257/82 |
| 4,818,728 | A | * | 4/1989 | Rai et al. | ..................... 438/108 |
| 5,898,223 | A | * | 4/1999 | Frye et al. | .................. 257/777 |
| 6,380,615 | B1 | | 4/2002 | Park et al. | |
| 6,683,384 | B1 | * | 1/2004 | Kossives et al. | ............ 257/777 |

FOREIGN PATENT DOCUMENTS

| DE | 101 24 774 A1 | 12/2002 |
| EP | 1 032 041 A2 | 8/2000 |
| JP | 2000-228485 A | 8/2000 |
| JP | 2000-243898 A | 9/2000 |

* cited by examiner

*Primary Examiner*—Jasmine Clark
(74) *Attorney, Agent, or Firm*—Dickstein, Shapiro, LLP.

(57) ABSTRACT

A plurality of interconnect layers are produced on a top side of one or two semiconductor chips, and are mutually isolated from one another in each case by insulation layers that are patterned in such a way that an interconnect layer applied as bridge makes contact with the interconnects applied previously.

10 Claims, 2 Drawing Sheets

METHOD FOR PRODUCING CHIP STACKS

CROSS-REFERENCE TO RELATED APPLICATION

This application is a continuation of International Patent Application Serial No. PCT/DE2004/000544, filed Mar. 17, 2004, which published in German on Oct. 7, 2004 as WO 2004/086497, and is incorporated herein by reference in its entirety.

FIELD OF THE INVENTION

The present invention relates to a method of producing chip stacks.

BACKGROUND OF THE INVENTION

Stacks of semiconductor chips can be produced by a procedure in which contact areas are in each case produced at the top sides of the semiconductor chips in a topmost metal layer of the wiring planes, which contact areas are covered with a passivation, a plated-through hole is in each case produced through the passivation and an electrically conductive connection is produced between the plated-through hole and an associated interconnect applied on the top side. The chips are arranged with the relevant top sides facing one another and opposite one another in such a way that the interconnects to be connected to one another are located one on top of the other. The interconnects are permanently connected to one another using diffusion soldering known per se, in particular the SOLID process. In order to produce the soldered connection, a thin solder layer is applied to the relevant interconnects of at least one of the semiconductor chips.

This production method affords the advantage, inter alia, of an additional relatively thin metal plane in the connecting zone (interface) of the two chips which can be used for wiring purposes. By way of example, in this interconnect plane which is provided only for connecting the chips, a rewiring of the chip contacts may be performed or the chips may be contact-connected by means of this plane to interconnects suitable for high frequencies (strip lines).

The connecting plane is formed in a single layer, however, so that the interconnects present therein cannot be bridged. A bridging of the interconnects present in the connecting plane is only possible if suitable electrically conductive connections are provided in one of the metallization planes of the wiring of the semiconductor chips themselves, which connections, via the plated-through holes to the interconnects connected to one another by means of diffusion soldering, short-circuit the interconnects. This requires two plated-through holes (vias) and a metal bridge in the topmost metallization plane of one of the chips that are to be connected to one another. A corresponding adaptation in the design of the metallization planes is therefore required as early as in the production of the chip.

SUMMARY OF THE INVENTION

A plurality of interconnect layers are produced on a top side of one or two semiconductor chips, and are mutually isolated from one another in each case by insulation layers that are patterned in such a way that an interconnect layer applied as bridge makes contact with the interconnects applied previously.

BRIEF DESCRIPTION OF THE DRAWINGS

Examples of the method according to the invention are described in more detail below with reference to FIGS. 1 to 5.

DETAILED DESCRIPTION OF PREFERRED EMBODIMENTS OF THE INVENTION

It is an object of the present invention to specify a method which makes it possible to realize in principle any desired connections of the topmost interconnects during the production of chip stacks by means of diffusion soldering.

The method involves covering an interconnect to be bridged on the top side of a semiconductor chip with an insulation layer or insulation covering. The interconnect to be bridged can then be bridged by a further interconnect layer applied to the same semiconductor chip; or the bridging is effected by means of an interconnect of the other semiconductor chip during the connection of the two semiconductor chips by means of diffusion soldering. It is possible, in particular, to produce a plurality of interconnect layers on the top side of one or the two semiconductor chips, which are mutually isolated from one another in each case by insulation layers. These insulation layers are patterned in such a way that regions of the surfaces of the interconnect plane applied previously are in each case uncovered and, at these locations, the respective subsequent interconnect layer makes contact with the interconnects applied previously. In the case of this method, therefore, the design of the semiconductor chips does not have to be adapted to a wiring that is only performed during the production of the semiconductor chip stack.

Figure 1:
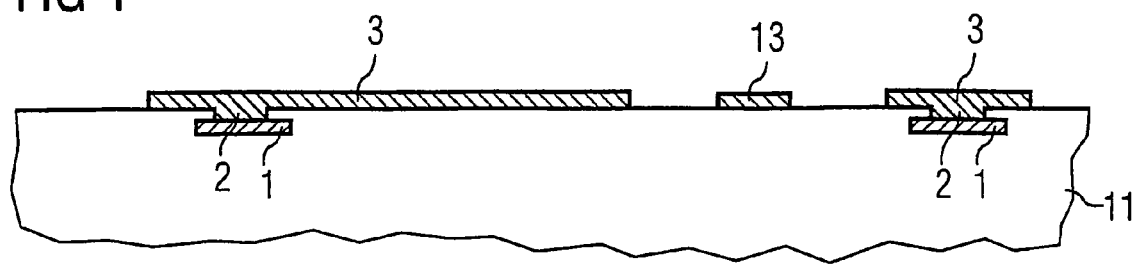
FIGS. 1 to 4 show semiconductor chips in cross section after various steps of the production method.

FIG. 1 shows a cross section through a first semiconductor chip 11, which is preferably still situated in the assembly of a wafer made of semiconductor material. Situated on the top side of the semiconductor chip are the customary metallization planes which are arranged between dielectric layers and form the wiring of the integrated circuit. Contact areas 1 in one of the metal layers, for example the topmost metal layer, of the wiring are depicted schematically in cross section in FIG. 1. Plated-through holes 2 (vias) having a diameter of typically approximately 2 μm are present, which cut through an electrically insulating layer applied on the top side, in particular also a passivation that may be present. Situated on the plated-through holes 2 are interconnects 3 provided for connection to interconnects of a further semiconductor chip by means of diffusion soldering. These electrical conductors are therefore produced in accordance with conventional methods for producing chip stacks by means of diffusion soldering.

A further interconnect, representing an interconnect 13 to be bridged, is depicted as an example in FIG. 1. This interconnect runs e.g. in strip-type fashion perpendicularly to the plane of the drawing. In this example, the interconnects 3 depicted on the left and on the right in the cross section are intended to be electrically conductively connected to one another during the production of the chip stack, in which case the interconnect 13 to be bridged is intended to remain electrically insulated from this connection. In the case of a conventional connection face-to-face of the two semiconductor chips to be connected to one another, the interconnect 13 to be bridged would be electrically conductively connected to interconnects of the further semiconductor chip which are provided only for an electrically conductive connection of the outer interconnects 3. Such an electrical connection of the interconnect 13 to be bridged is intended to be avoided, however.

Figure 2:
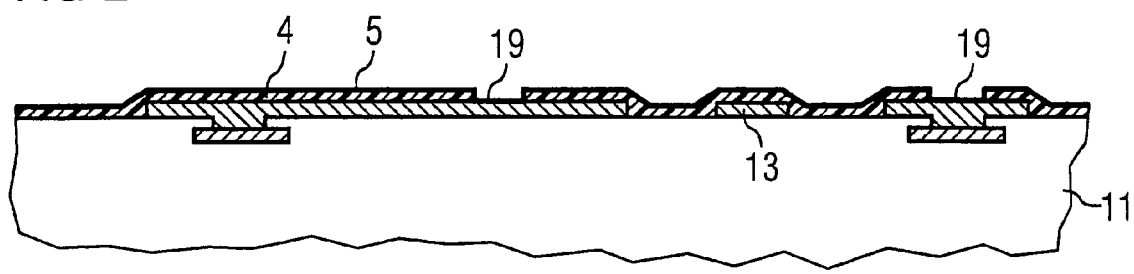

Therefore, in accordance with the cross section of FIG. 2, firstly an insulation layer 4 is applied to the top side of the first semiconductor chip 11, which insulation layer covers the interconnects 3, 13 present. The insulation layer 4 is patterned with openings 19, however. This may be done by firstly applying the insulation layer 4 over the whole area and subsequently etching out the openings 19 in the layer. However, it is possible, as early as during the application of the insulation layer, to use suitable masking to ensure that the insulating material of the insulation layer 4 remains omitted in the region of the envisaged openings 19. The insulation layer 4 is preferably produced by firstly applying a photosensitive material, in particular polyimide, over the whole area and then patterning it photolithographically. Instead of photolithography, however, it is also possible to employ a printing method. Preferably, but not absolutely necessarily, a base layer 5 is then applied over the whole area, the base layer preferably comprising an adhesion layer or barrier layer (e.g. TiW, 50 nm thick) and, if appropriate, a thin seed layer (typically 100 nm thick) made of the metal (e.g. copper) of the interconnects provided. The adhesion layer is provided in particular for promoting the deposition of a subsequent layer made of a metal (here copper).

Figure 3:
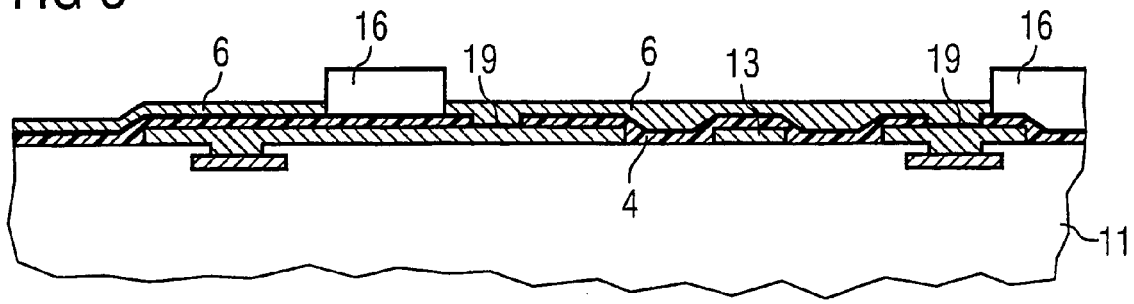

FIG. 3 illustrates in cross section that a first further interconnect layer 6 is then applied and patterned using a mask 16. The mask 16 defines the later insulation zones and is e.g. a photoresist. The further interconnect layer 6 is preferably applied by electrodeposition and may e.g. be copper, as already mentioned. The mask 16 is then removed. An optionally applied base layer 5 is removed in the openings thereby formed. The different portions of the first further interconnect layer 6 that are thus formed are electrically insulated from one another in this way.

The interconnect layer 6 may be thin if further layers are provided before the topmost metal layer is applied for the connection by means of diffusion soldering. Until the topmost metal layer is attained, therefore, the further interconnect layers may be formed independently of the metallurgical requirements imposed by the diffusion soldering. In this case, the layer thickness depends, in particular, only on the electrical requirements and may e.g. typically be 0.5 µm. The interconnect layers are at any rate preferably thinner than 1 µm. The interconnects 3 applied first may likewise have this small thickness. The planarizing properties of the electrodeposition have a very advantageous effect. On account of the small layer thickness, the layers may, however, also be applied by means of sputtering and etching processes.

Figure 4:
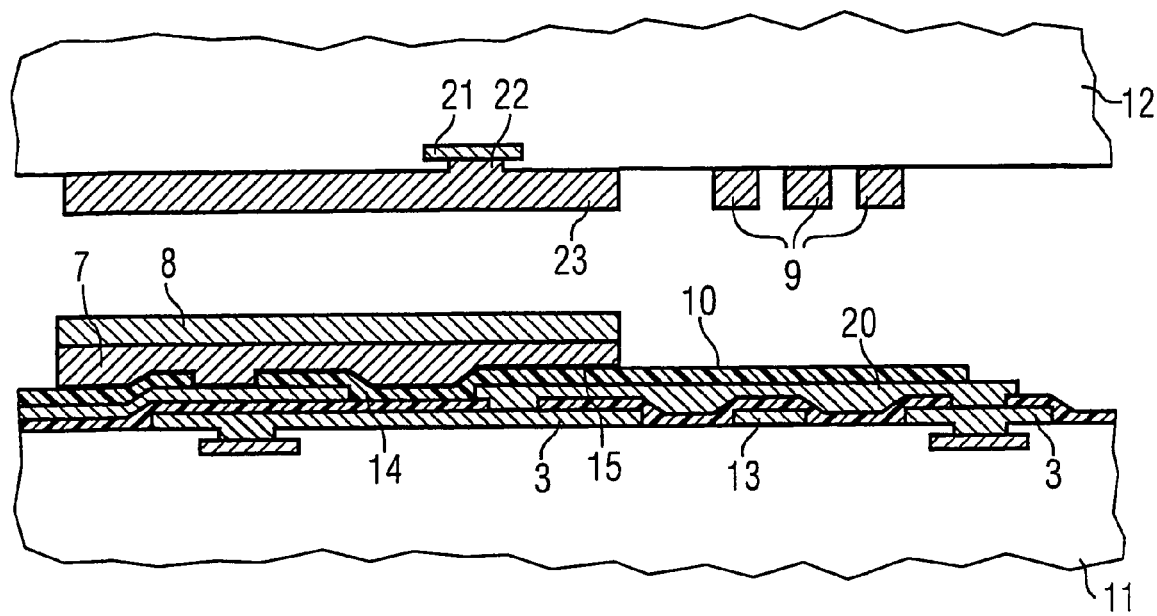

The illustration of FIG. 4 depicts, as further layers, a further insulation layer 14, a further base layer 15 and, finally, a topmost metal layer 7, which, if necessary, may be provided with a solder layer 8 (e.g. tin) for the diffusion soldering. The same layer thickness can be chosen for all the interconnect layers, with the exception of the topmost metal layer 7. The topmost metal layer 7 is applied with a sufficient thickness in accordance with the metallurgical requirements of the diffusion process. The solder layer 8 may be applied; however, a solder may also be applied on the surface of a topmost metal layer of the second chip of the chip stack.

The second semiconductor chip 12, which is intended to be combined with the first semiconductor chip 11 to form the chip stack, is illustrated at the top in the cross section of FIG. 4. The second semiconductor chip 12 likewise has contact areas 21 in one of the metal layers, for example in this case as well in the topmost metal layer, which is situated at the bottom in the arrangement illustrated in FIG. 4. The relevant top side of the second semiconductor chip 12 is covered with an electrically insulating layer and, if appropriate, with a passivation. Plated-through holes 22 are present in the insulating layer in order that an interconnect 23 applied on the top side is electrically conductively connected to a respective contact area 21. FIG. 4 also depicts interconnects 9 on the top side of the second semiconductor chip 12 facing the first semiconductor chip 11, which interconnects, in this example, run in strip-type fashion perpendicularly to the plane of the drawing and are not intended to be connected to connections of the first semiconductor chip 11. Therefore, in the region of the interconnects 9, the top side of the first semiconductor chip 11 is formed only by a free portion 10 of the topmost insulation layer, in this case of the further insulation layer 14.

It can additionally be discerned in FIG. 4 that a portion of the first further interconnect layer 6 between the regions of the openings 19 provided in the insulation layer 4 forms a bridge 20 spanning the interconnects 3 to be connected. In accordance with the arrangement illustrated in cross section in FIG. 4, the first semiconductor chip 11 and the second semiconductor chip 12 may be placed one on top of the other and be connected to one another by diffusion soldering. On account of the further interconnect layers that are in each case isolated from one another by insulation layers 4, 14, a more complicated wiring than was the case with conventional single-layered connecting layers is possible in the connecting plane between the semiconductor chips 11, 12.

Figure 5:
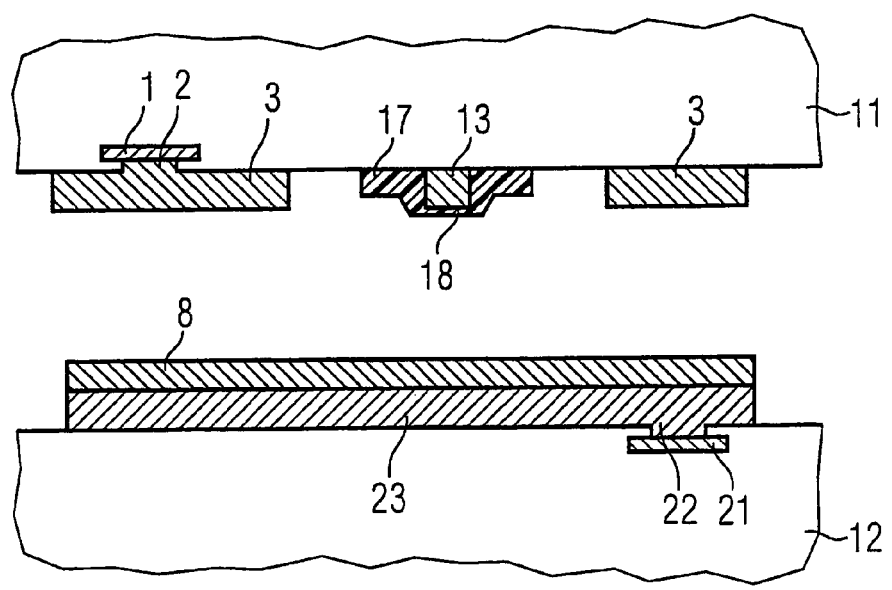
FIG. 5 shows an arrangement of second semiconductor chips in cross section for a further embodiment of the production method.

FIG. 5 illustrates an arrangement of a first semiconductor chip 11 and a second semiconductor chip 12, which are connected to form the semiconductor chip stack in an alternative production method with simultaneous formation of a bridge spanning an interconnect. The two semiconductor chips or wafers are metalized during the method of diffusion soldering. The two metal layers are soldered together to form a single layer by means of the soldering process. In the alternative exemplary embodiment, these metal layers that are specifically provided for the diffusion soldering are already used to bridge interconnects without the need to deposit a further metal layer corresponding to the further interconnect layer 6 of the previous exemplary embodiment. For this purpose, the interconnect 13 to be bridged is covered with an insulation covering 17 having a thin upper portion 18 on the top side of the interconnect 13 to be bridged. The upper portion 18 has a smaller thickness than the solder layer 8, which, in this exemplary embodiment, is applied on an interconnect 23 of the second semiconductor chip 12. The remaining components correspond to those of FIG. 4 and are therefore provided with the same reference symbols.

If the interconnects 3, 23 of the two chips are brought into contact, the molten solder material of the solder layer 8 (e.g. tin) is laterally displaced by the upper portion 18 of the insulation covering 17. This process is noncritical for the production of the connection since the displaced volume of the solder material is restricted to the width of the interconnects and the upper portion 18 of the insulation covering 17 is sufficiently thin. Beside the interconnects, therefore, there is a sufficiently large volume which is initially still free and in which the portions of the solder layer 8 are taken up. Photopatternable polyimide is preferably taken into consideration as material for the insulation covering 17. The insulation covering is preferably deposited with a thickness of less than 1 µm. Instead of polyimide, it is possible to use some other material which withstands the soldering temperature of typically approximately 300° C. and does not react with the solder material.

What is claimed is:

1. A method for producing chip stacks, comprising the steps of:
   providing a first semiconductor chip with first contact areas in a metal layer covered with an electrically insulating layer;
   producing at least two plated-through holes to at least two of said first contact areas, respectively, and first interconnects are respectively connected to the at least two plated-through holes;
   providing a second semiconductor chip with a second contact area in a metal layer covered with an electrically insulating layer;
   producing a plated-through hole to the second contact area with a second interconnect connected to the plated-through hole;
   producing a third interconnect to be bridged on a top side of the first semiconductor chip which has the first interconnect;
   applying an insulation layer covering the first and third interconnects of the first semiconductor chip, which insulation layer is provided with openings on respective top sides of the first interconnects to be connected;
   applying at least one fourth interconnect, which contacts the first interconnects to be connected, in the relevant openings of the insulation layer;
   arranging the first semiconductor chip and the second semiconductor chip to be opposite one another such that the first and second interconnects lie on top of one another; and
   permanently electrically conductively connecting the first and second interconnects to one another by means of diffusion soldering using a solder layer applied to at least one of the first and second interconnects that are respectively to be connected to one another.

2. The method as claimed in claim 1, wherein the fourth interconnect is applied by electrodeposition with a thickness of less than 1 µm.

3. The method as claimed in claim 1, wherein prior to the application of the fourth interconnect, performing the step of applying a base layer for a purpose of improving subsequent deposition.

4. The method as claimed in claim 1, wherein the insulation layer is a polyimide that can be patterned photolithographically.

5. A method for producing chip stacks, comprising the steps of:
   providing a first semiconductor chip with first contact areas in a metal layer covered with an electrically insulating layer;
   producing at least two plated-through holes to at least two of said first contact areas, respectively, and first interconnects are respectively connected to the at least two plated-through holes;
   providing a second semiconductor chip with a second contact area in a metal layer covered with an electrically insulating layer;
   producing a plated-through hole to the second contact area with a second interconnect connected to the plated-through hole;
   applying a solder layer to the second interconnect of the second semiconductor chip;
   producing a third interconnect to be bridged on a top side of the first semiconductor chip which has the first interconnects;
   applying an insulation covering that covers the third interconnect of the first semiconductor chip, wherein the insulation covering has an upper portion having a smaller thickness than the solder layer;
   arranging the first semiconductor chip and the second semiconductor chip to be opposite one another such that the first and second interconnects lie on top of one another;
   permanently electrically conductively connecting the interconnects to one another by means of diffusion soldering; and
   during the connection of the semiconductor chips, displacing the solder layer between the third interconnect of the first semiconductor chip and the second interconnect of the second semiconductor chip.

6. The method as claimed in claim 4, wherein the insulation covering is a polyimide that can be patterned photolithographically.

7. A method for producing chip stacks, comprising the steps of:
   producing a plurality of first interconnect layers on a top side of a first semiconductor chip;
   producing a plurality of second interconnect layers on a top side of a second semiconductor chip;
   applying and patterning insulation layers such that the interconnect layers of the first and second semiconductor chips are mutually isolated from one another;
   applying a further interconnect layer as a bridge to contact with the first interconnect layers;
   arranging the first semiconductor chip and the second semiconductor chip to be opposite one another such that the first and second interconnects lie on top of one another; and
   permanently electrically conductively connecting the first and second interconnects to one another by means of diffusion soldering using a solder layer applied to at least one of the first and second interconnects that are respectively to be connected to one another.

8. A method for producing chip stacks, comprising the steps of:
   producing a plurality of first interconnect layers on a top side of a first semiconductor chip;
   producing a plurality of second interconnect layers on a top side of a second semiconductor chip;
   applying and patterning insulation layers such that the interconnect layers of the first and second semiconductor chips are mutually isolated from one another;
   applying a further interconnect layer as a bridge to contact with the first interconnect layers;
   applying a solder layer to the second interconnect of the second semiconductor chip;
   arranging the first semiconductor chip and the second semiconductor chip to be opposite one another such that the first and second interconnects lie on top of one another;
   permanently electrically conductively connecting the interconnects to one another by means of diffusion soldering; and
   during the connection of the semiconductor chips, displacing the solder layer between the third interconnect of the first semiconductor chip and the second interconnect of the second semiconductor chip.

9. A chip stack comprising:
a first semiconductor chip with first contact areas in a metal layer covered with an electrically insulating layer;
at least two plated-through holes connected to at least two of said first contact areas, respectively, and first interconnects respectively connected to the at least two plated-through holes;
a second semiconductor chip with a second contact area in a metal layer covered with an electrically insulating layer;
a plated-through hole connected to the second contact area with a second interconnect connected to the plated-through hole;
a third interconnect bridged on a top side of the first semiconductor chip which has the first interconnect;
an insulation layer covering the first and third interconnects on the first semiconductor chip, which insulation layer is provided with a respective opening on a respective top side of the first and having third interconnects to be connected; and
at least one fourth interconnect, which contacts the first interconnect to be connected, in the relevant openings of the insulation layer,
wherein the first semiconductor chip and the second semiconductor chip are arranged to be opposite one another such that the first and second interconnects lie on top of one another, and
wherein the first and second interconnects are permanently electrically conductively connecting to one another by means of diffusion soldering using a solder layer applied to at least one of the first and second interconnects that are respectively to be connected to one another.

10. A chip stack comprising:
a first semiconductor chip with first contact areas in a metal layer covered with an electrically insulating layer;
at least two plated-through holes connected to at least two of said first contact areas, respectively, and first interconnects are respectively connected to the at least two plated-through holes;
a second semiconductor chip with a second contact area in a metal layer covered with an electrically insulating layer;
a plated-through hole connected to the second contact area with a second interconnect connected to the plated-through hole;
a solder layer applied to the second interconnect of the second semiconductor chip;
a third interconnect bridged on a top side of the first semiconductor chip which has the first interconnects;
an insulation covering that covers the third interconnect to the first semiconductor chip, wherein the insulation covering has an upper portion having a smaller thickness than the solder layer; and
wherein the first semiconductor chip and the second semiconductor chip are arranged to be opposite one another such that the first and second interconnects lie on top of one another,
wherein the interconnects are permanently electrically conductively connected to one another by means of diffusion soldering; and
wherein during the connection of the semiconductor chips, the solder layer between the third interconnect of the first semiconductor chip and the second interconnect of the second semiconductor chip is displaced.

* * * * *